United States Patent [19]

Bevacqua

[11] 4,118,991
[45] Oct. 10, 1978

[54] TUNING DISPLAY MECHANISM FOR MULTIBAND PUSHBUTTON TUNABLE RECEIVER

[75] Inventor: Louis Albert Bevacqua, Des Plaines, Ill.

[73] Assignee: Motorola Inc., Schaumburg, Ill.

[21] Appl. No.: 755,702

[22] Filed: Dec. 30, 1976

[51] Int. Cl.² ............................................. F16H 35/18
[52] U.S. Cl. ...................................... 74/10.33; 334/7; 116/124.1 R
[58] Field of Search ................ 74/10.33, 10.1, 483 PB, 74/10.31, 29, 27; 334/7, 86, 87; 116/124.1 R, 124.2 R

[56] References Cited

U.S. PATENT DOCUMENTS

| 2,112,111 | 3/1938 | McWeery | 116/124 R |
| 2,419,968 | 5/1947 | Roberts | 334/7 |

FOREIGN PATENT DOCUMENTS 262,121  9/1947  Switzerland ........................... 116/124.1

*Primary Examiner*—Samuel Scott
*Assistant Examiner*—G. A. Anderson
*Attorney, Agent, or Firm*—James W. Gillman; Donald J. Lisa; Phillip H. Melamed

[57] ABSTRACT

A selective frequency scale display mechanism for a pushbutton AM and FM radio receiver is disclosed. Presetable cam projections are located on each of a plurality of tuning pushbuttons and predesignate each pushbutton for tuning the radio to either the AM or FM frequency waveband. Manual actuation of a tuning pushbutton causes a band selecting cam projection to selectively engage and pivot a pivotal plate which results in actuating an overcenter spring assembly that in turn pivots a multisurface display body having different longitudinally extending scales on each of a plurality of its surfaces. In this manner, manual actuation of a tuning pushbutton results in selecting the band to which the radio will be tuned to, selecting the individual frequency within this band that the radio will be tuned to, and providing a visual display of the longitudinally extending scale which corresponds to the selected band. The pivotal plate is positioned such that after initial engagement with the band selecting cam projecting it is pivoted out of engagement with the cam projection by operation of the overcenter spring assembly and therefore the plate does not interfere with the frequency tuning operation of the pushbutton resulting from the full inward manual depression of the pushbutton.

17 Claims, 3 Drawing Figures

TUNING DISPLAY MECHANISM FOR MULTIBAND PUSHBUTTON TUNABLE RECEIVER

BACKGROUND OF THE INVENTION

The invention generally relates to the field of tuning display mechanisms for a multiband pushbutton tunable receiver. More particularly the present invention relates to an improved tuning display mechanism for an AM-FM radio receiver in which manual actuation of a tuning pushbutton results in selectively displaying the proper longitudinally extending scale which corresponds to the waveband to which the pushbutton has been predesignated to by a cam assembly carried by the pushbutton.

Generally, radio tuning displays have simultaneously displayed scales for all of the frequency wavebands which the radio can be tuned to. This is undesireable since there is only a limited amount of available visual display space on the front face of the radio receiver. Thus if all of the tuning scales which correspond to each of the different wavebands which the radio can be tuned to must be simultaneously displayed, then the size of each of these scales must be minimized in order to fit all of these scales within the limited amount of available display space. In addition, if all of the tuning scales are simultaneously displayed, the radio operator may become confused as to what frequency band his radio is currently tuned to.

Some prior art radio receivers have provided a pivotal display mechanism in which different longitudinally extending scales are displayed in response to the rotary motion of a manually actuatable band selector switch. While these prior art receivers do maximize the use of the available space at the front of the receiver for tuning display purposes, they require that the band and tuning display selector be initially manually actuated. Subsequently, a separate manual actuation of a tuning device is required to tune the radio to a specific desired frequency in the selected band.

Some prior art radio tuning devices have provided manually actuatable tuning pushbuttons which upon manual actuation simultaneously select one of a plurality of wavebands and also select a predetermined frequency within the selected waveband. A U.S. Patent to Wolf et al., No. 3,247,728, which is assigned to the same assignee as the present invention illustrates one such device. However these devices in no way illustrate or suggest providing a tuning display which selectively visually displays only the longitudinally extending scale that corresponds to the selected waveband in response to manual actuation of the tuning pushbutton. No provision is made for such a selective display in these prior art devices and there is no teaching of how such a display could be constructed without interfering with the tuning of the radio which is controlled by the substantially uninhibited inward slidable motion of the tuning pushbutton.

SUMMARY OF THE INVENTION

An object of the present invention is to provide an improved tuning display mechanism for a multiband pushbutton tunable receiver which overcomes all of the aforementioned deficiencies.

A more specific object of the present invention is to provide an improved tuning display mechanism for a multiband pushbutton radio receiver which selectively displays the proper longitudinally extending frequency scale in response to the manual actuation of a tuning pushbutton which has been predesignated to select one of a plurality of different frequency wavebands for the receiver.

In one embodiment of the present invention a tuning display mechanism for a multiband pushbutton tunable receiver is disclosed. The tuning display mechanism comprises: a receiver with a chassis; a plurality of manually slidably actuatable pushbutton tuning assemblies, each coupled to the chassis for tuning the receiver to predetermined frequencies in any of a plurality of frequency wavebands upon manual actuation; cam means, mounted to each of said pushbutton tuning assemblies for slidable movement therewith during actuation, for predesignating each of the pushbutton tuning assemblies for tuning the reciever to the frequencies in one of the plurality of different frequency wavebands; and tuning display means coupled to the chassis and capable of selectively displaying longitudinally extending scales corresponding to each of the plurality of frequency wavebands, each of the predesignating cam means being positioned for selectively engaging a portion of the tuning display means upon manual sliding actuation of the one of the pushbutton assemblies carrying the cam means to select and display the longitudinally extending scale corresponding to the waveband to which the manually actuated pushbutton assembly has been predesignated to.

In the preferred embodiment of the present invention, the portion of the tuning display means which engages the predesignating cam means is part of a pivotally mounted plate having portions for selectively initially engaging the predesignating cam means in response to actuation of the pushbutton assembly carrying the predesignating cam means and subsequently pivoting the plate to position the initially engaging portion thereof out of engagement with the predesignating cam means. The pivotal position of the plate controls the selection of which one of the longitudinally extending scales will be displayed and after a scale has been selected the plate will be positioned out of the way of the slidably actuatable tuning pushbutton and its predesignating cam means. The pivotal position of the plate is used, in conjunction with an overcenter spring assembly, to control the position of a pivotally mounted display body which has a plurality of surfaces, each surface having a different longitudinally extending scale thereon corresponding to each of the wavebands to which the radio can be tuned to.

The use of the pivotal plate, the pivotal display body and the overcenter spring assembly results in a simplifid tuning display mechanism in which all of the available display space at the front of the radio reciever is utilized. In addition, the combination of these elements provides a tuning display mechanism which selectively displays the proper longitudinally extending scale in response to the actuation of a tuning pushbutton which has been predesignated to a particular frequency waveband and the foregoing has been accomplished with a simplified structure that does not interfere with the tuning operation performed by the tuning pushbutton. The use of an overcenter spring assembly insures that the tuning display mechanism of the present invention will not substantially add to the insertion force required to be applied to any of the tuning pushbuttons since the overcenter spring will assist in rotating the display body after an initial insertion force has been applied. Also in the preferred embodiment of the present invention, the waveband predesignating cam means are adjustably presettable so that they can be manually adjusted by the radio operator to select the display corresponding to and tune the radio to any of the possible wavebands.

BRIEF DESCRIPTION OF THE DRAWINGS

For a more complete understanding of the invention reference should be made to the drawings, in which.

DESCRIPTION OF THE PREFERRED EMBODIMENT

Figure 1:
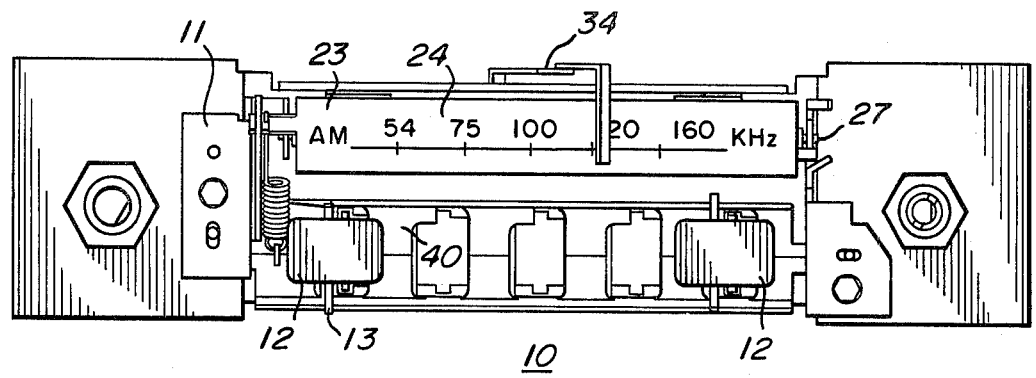
FIG. 1 is a front planar view of a portion of a pushbutton tunable AM-FM radio receiver which uses the tuning display mechanism of the present invention.

FIG. 1 illustrates a pushbutton tunable AM-FM radio receiver 10 with its exterior casing removed. The receiver 10 uses the tuning display mechanism of the present invention which is shown in greater detail in FIGS. 2 and 3. Since FIGS. 1, 2 and 3 all illustrate essentially the same structure in various forms of assembly and in various views, identical reference numbers will be used to identify corresponding parts.

Figure 2:
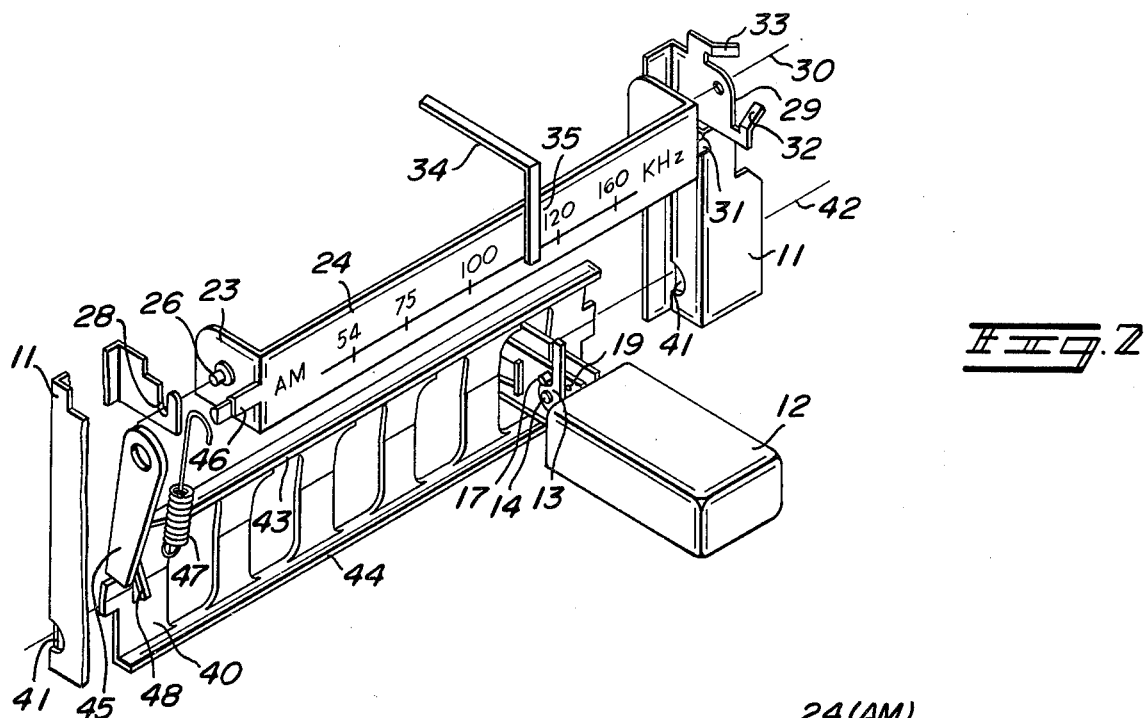
FIG. 2 is an exploded assembly perspective view of portions of the radio receiver illustrated in FIG. 1.
Figure 3:
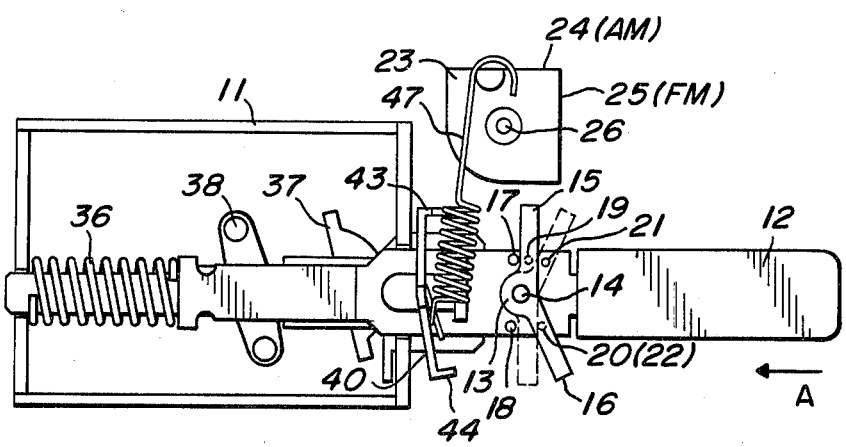
FIG. 3 is an assembled side view of the radio receiver illustrated in FIG. 1 in which portions have been removed in order to more clearly illustrate the operation of the tuning display mechanism of the present invention.

The radio receiver 10 includes a chassis 11 which provides support and protection for the components of the radio receiver. A plurality of manually slidably actuatable pushbuttons 12 are illustrated in FIG. 1, and these pushbuttons are coupled to the chassis 11 for tuning the receiver 10 to predetermined frequencies in either the AM or FM frequency wavebands upon manual inward actuation (direction A in FIG. 3) of the pushbutton 12. Only two pushbuttons, out of a possible five, are illustrated in FIG. 1 and only one pushbutton is illustrated in FIGS. 2 and 3 for the purposes of clarity.

A manually adjustable presettable cam projection 13 is illustrated as being mounted on each of the tuning pushbuttons 12 for slidable movement along therewith during the manual actuation of the pushbutton. These cam projections 13 predesignate each of their associated pushbuttons for tuning the receiver 10 to frequencies in either the AM or FM band upon manual actuation of the pushbutton 12. The cam projections 13 are illustrated as being manually adjustable in FIGS. 1, 2 and 3 however having fixed non-adjustable cam projections is within the scope of this invention. Each of the presettable cam projections 13 is pivotally mounted at its center to an associated pushbutton 12 by a rivet 14 and each cam projection 13 has upper and lower extending arms 15 and 16, respectively. Projections 17 and 18 are provided on each pushbutton 12 to provide positive stops for inhibiting the pivotal motion of the cam projection 13 and serve to limit the extent to which the cam 13 can be manually pivoted. Detents 19 and 20 exist on the extending arms 15 and 16, respectively, and mate with dimples 21 and 22, respectively on each pushbutton 12 to define first and second relatively fixed positions into which the presettable cam projection 13 can be manually rotated into. The first of the cam projection 13 is illustrated by solid lines in FIG. 3 and the second position is illustrated by dashed lines in FIG. 3.

A display body 23 having a first planar surface 24 and a second planar surface 25 is illustrated as being pivotally mounted to the chassis 11 by and projections 26 and 27 which are matingly received in a notch 28 and a hole 29, respectively, in the chassis 11. The end projections 26 and 27 lie along a pivotal axis 30 about which the display body 23 pivots. A longitudinally extending scale corresponding to the AM frequency scale is displayed on the planar surface 24, while a longitudinally extending scale corresponding to the FM waveband is displayed on the planar surface 25. The casing (not shown) of the radio reciever 10, is contempleted as having a visual opening in its front such that either the surface 24 or 25, depending upon the pivotal position of the display body 23, will be visable through the casing from the front of the radio 10.

The display body 23 has as end projection 31 (FIG. 2) which extends outward parallel to axis 30 and which, together with stop members 32 and 33, that are part of the chassis 11, selectively determine first and second pivotal positions for the display body 23. With the projection 31 contacting the stop member 32, the display body 23 is in a first pivotal position and the AM scale on the surface 24 can be viewed from the front of the radio through its casing. With the projection 31 contacting the stop member 33, the FM longitudinal scale on the surface 25 can be viewed from the front of the radio. A frequency indicating pointer 34 is illustrated as being pivotally attached to the chassis 11 and having a downwardly extending arm 35 which is positioned between the display body 23 and the front opening in the casing of the radio receiver 10. The frequency pointer 34 and its arm 35 are contemplated as being operable in the same manner that such frequency pointers are normally operable in the operation of pushbutton tuned radios. Therefore there will be no further discussion of these members except to state that the position of the frequency pointer 34 will correspond to the specific frequency, in either the AM or FM band, that the radio receiver 10 is tuned to.

As is best illustrated in FIG. 3, each pushbutton 12 is contemplated as being part of a tuning assembly which is mainly enclosed in the chassis 11. The tuning assembly consists of a spring 36 normally biasing the pushbutton 12 toward an outward position, a presettable cam slide 37 which is carried by the pushbutton 12 and a treadle bar 38 which is engaged by the presettable cam 37 to tune the radio upon inward (A) manual actuation of the pushbutton 12. An example of a tuning assembly of this general type, including components corresponding to the components 12, 36, 37 and 38, is descirbed in a U.S. patent to Bevacqua, No. 2,967,431, which is assigned to the assignee of the present invention. Since such tuning assemblies are generally well known further description of this tuning assembly will not be provided except to state that the tuning assembly provides for tuning the receiver 10 and pivoting the frequency pointer 34 such that the pointer provides an indication of the frequency selected.

A plate 40 is pivotally mounted to the chassis 11 in D-shaped holes 41 therein and is pivotal along an axis 42 which is parallel to the axis 30 about which the display body 23 is pivotal. The plate 40 is positioned between the pushbutton predesignating cam 13 and the treadle bar tuning assembly 36–38. The plate 40 has a plurality of holes therein through which the slidable motion of the pushbuttons 12 can be transmitted to their associated presettable cam slides 37. The plate 40 has an upper portion 43 and a lower portion 44 which are positioned for initially selectively engaging the upper or lower arms 15 and 16, respectively, of the predesignating cam 13. The plate 40 has an arm extention 45 rigidly attached thereto which couples the plate 40 to an extention 46 rigidly attached to the display body 23. A spring 47 has one end coupled to the display body projection 46 and another end coupled to a projection 48 rigidly attached to the plate 40.

The plate 40, its extension arm 45, the spring 47 and pivotal display body 23 are positioned with respect to each other such that together they form an overcenter spring assembly for the pivotal bodies 23 and 40. The operation of the overcenter spring assembly essentially creates first and second stable positions for both the pivotal tuning display body 23 and the pivotal plate 40. In the first stable position, the AM longitudinal scale on the surface 24 will be visable through a front opening in the casing, the spring 47 will exert a clockwise torque on the pivotal body 23, the projection 31 of the pivotal body 23 will rest against the stop member 32 of the chassis 11, and the upper portion 43 of the plate 40 will extend further towards the front of the receiver 10 than the lower portion 44. In the second stable position, the FM longitudinal scale on the surface 25 will be visable through the front opening in the casing, the spring 47 will exert a counterclockwise torque on the pivotal body 23, the projection 31 will rest against the stop member 23, and the lower portion 44 of the plate 40 will extend further towards the front of the receiver 10 than the upper portion 43. The second stable position is generally illustrated in FIG. 3, in which the rigid extending arm 45 has been removed for the purpose of clarity. The first stable position is generally illustrated in FIGS. 1 and 2.

The operation of the present invention is as follows. Each frequency tuning pushbutton 12 has either a fixed or adjustable band selecting cam such as 13. In FIG. 3, the adjustable cam 13 is illustrated in solid lines as predesignating the pushbutton 12 for the FM band. In order to predesignate this same pushbutton for the AM band, the predesignating cam 13 would be manually pivoted such that the detent 19 and dimple 21 coincide and would therefore hold the cam 13 in the position shown by the dashed lines in FIG. 3. With the cam 13 predesignated to select the AM band, manual inward actuation of the pushbutton 12 in the direction shown in the arrow A (which is perpendicular to axes 30 and 42) will result in the lower arm 16 of the cam 13 initially contacting the lower portion 44 of the plate 40. This will result in pivoting the plate 40 from its second stable position, shown in FIG. 3, to its first stable position. This occurs in the following manner.

When the cam 13 contacts the portion 44, the plate 40 will initially begin to pivot and by means of the rigidly attached arm 45 this will cause the display body 23 also to pivot. Further movement of the pushbutton 12 in the direction A will continue to pivot these two bodies until the spring 47 begins to exert a clockwise torque on the pivotal display body 23. When this occurs, the display body 23 will snap into its AM display position and the plate 42 will snap into its corresponding first position with the portion 44 out of engagement with the arm 16 of the predesignating cam 13. Further inward motion of the pushbutton 12 will now merely result in completing the tuning motion of the radio by having the cam slide 37 set the rotational position of the treadle bar 38. No portion of the cam 13 will contact the plate 40 during this further inward motion which is required to complete the tuning operation. Thus the overcenter spring action of the present invention has resulted in pivoting the plate 40 such that it will be out of engagement with the band selecting cam 13 after the initial contact of the arm 16 with the portion 44. This prevents the plate 40 from interfering with the slidable tuning action of the pushbutton 12 and tuning assembly 36-38.

The operation of the present invention when switching from an AM to an FM display is similar except that in the AM to FM transition, the upper arm 15 of the adjustable cam 13 will contact the upper portion 43 of the plate 40 and result in pivoting this plate such that the end result will be the configuration illustrated in FIG. 3, with the FM surface 25 being displayed through a front opening in the casing of the radio 10.

While no electronic band selection switch for the receiver 10 has been illustrated in the present drawings, the existence of such a switch is contemplated by the present invention. Such a switch could be actuatable by the pivotal motion of the plate 40 and could comprise a microswitch whose operative state depends upon whether the plate 40 is in its first or second stable pivotal positions.

If an AM designated pushbutton is actuated while the AM display face is being displayed by the pivotal display body 23, this will not result in changing the pivotal positions of the plate 40 or the display body 23. This is because no portion of the band selecting cam 13 will contact the plate 40 upon actuation of the AM pushbutton since the portion 44 of the plate 40 will be out of contact of the lower arm 16 of the cam 13 for all positions of the AM pushbutton and the upper arm 15 of the cam 13 will be positioned such that it cannot contact the portion 43 of the plate 40 during actuation of the pushbutton 12. Similar statements would apply to the actuation of a pushbutton predesignated to the FM band whenever the FM display surface 25 was already being displayed by the radio receiver 10.

Thus the present invention has provided a low insertion force tuning display mechanism since the overcenter spring assembly only requires that enough force be present to initiate the overcenter spring action. The present invention has also provided a tuning display mechanism in which by pivoting the plate 40 out of engagement with the predesignating cam 13 whenever a change in the pivotal position of the plate 40 is implemented, there is no possibility of interfering with the slidable tuning motion of the pushbutton 12. In addition, the present invention has provided a simplified apparatus in which the manual actuation of predesignated pushbuttons results in the selective display of different longitudinally extending scales and thereby maximizes the effective use of all of the available scale display space in a pustbutton tunable radio receiver.

While I have shown and described specific embodiments of this invention further modifications and improvements will occur to those skilled in the art. All such modifications which retain the basic underlying principles disclosed and claimed herein are within the scope of this invention.

I claim:

1. A tuning display mechanism for a mutliband pushbutton tunable receiver, including in combination:
   a receiver with a chassis;
   a plurality of manually slidably actuatable pushbutton tuning assemblies each coupled to said chassis for tuning said receiver to predetermined frequencies in any of a plurality of frequency wavebands upon manual actuation;

cam means, mounted to each of said puchbutton tuning assemblies for slidable movement therewith during actuation, for predesignating each of said pushbutton tuning assemblies for tuning said receiver to the frequencies in one of said plurality of different frequency wavebands; and tuning display means coupled to said chassis and capable of selectively displaying longitudinal extending scales corresponding to each of said plurality of frequency wavebands, each of said predesignating cam means positioned for selectively engaging a portion of said tuning display means upon manual sliding actuation of the one of said pushbutton assemblies carrying said cam means to select and display the longitudinally extending scale corresponding to the waveband to which said manually actuated pushbutton assembly has been predesignated to.

2. A tuning display mechanism according to claim 1 wherein said tuning display means includes a pivotal display body having a plurality of surfaces, each surface having a different longitudinal scale thereon corresponding to a different waveband in said plurality of wavebands, said tuning display means displaying different longitudinally extending scales by displaying one of said surfaces at a time in response to said pivotal display body being in different pivotal positions.

3. A tuning display mechanism according to claim 2 wherein each of said predesignating cam means comprises at least one arm projection and wherein said tuning display means includes an overcenter spring assembly for said pivotal display body, each arm projection selectively contacting a portion of said overcenter spring assembly in response to the manual actuation of the pushbutton carrying the projection for selectively pivoting said pivotal body for displaying the longitudinally extending scale of the one of said wavebands which said pushbutton had been predesignated to.

4. A tuning display mechanism according to claim 3 wherein said tuning display means includes a pivotal plate having an extension arm coupled to said pivotal display body and wherein a spring is coupled to at least one of said pivotal plate and said pivotal display body; said spring, said pivotal display body, and said pivotal plate comprising said overcenter spring assembly and slidable movement of said pushbuttons selectively causing said pivotal plate to pivot and resulting in said extension arm pivoting said pivotal display body.

5. A tuner display mechanism according to claim 4 wherein said pushbutton tuning assemblies actuate a treadle bar tuning assembly and wherein said pivotal plate is positioned between said treadle bar assembly and said predesignating cam means.

6. A tuning display mechanism according to claim 5 wherein said pivotal plate has apertures for permitting the transmission of the slidable motion of said pushbutton tuning assemblies therethrough to said treadle bar assembly.

7. A tuning display mechanism according to claim 4 which includes said stop means for selectively locating said pivotal display body in at least first and second fixed pivotal positions with respect to said chassis in response to the pivotal position of said pivotal plate being moved into corresponding first and second positions by said predesignating cam means.

8. A tuning display mechanism according to claim 7 wherein said stop means includes at least one projection extending from said pivotal display body.

9. A tuning display mechanism according to claim 8 wherein said pivotal display body in said first fixed position displays a waveband scale corresponding to an AM frequency band and wherein said pivotal display body in said second fixed position displays a waveband scale corresponding to an FM waveband.

10. A tuning display mechanism according to claim 4 wherein each of said cam means is adjustable and can be manually positioned to select any of said plurality of wavebands as corresponding to an associated pushbutton tuning assembly.

11. A tuning display mechanism according to claim 1 wherein said portion of said tuning display means which engages said predesignating cam means is part of a pivotally mounted plate with a portion for selectively initially engaging said cam means in response to actuation of the pushbutton assembly carrying said cam means and wherein said tuning display means includes structure for selectively pivoting said plate to position said initially engaging portion out of engagement of said cam means upon further actuation of said pushbutton assembly.

12. A tuning display mechanism according to claim 11 wherein said pivotal plate has first and second relatively fixed positions which correspond to the displaying of first and second different longitudinally extending scales.

13. A tuning display mechanism according to claim 12 wherein said tuning display means includes a pivotal display body having a plurality of surfaces, each surface having a different longitudinal scale thereon corresponding to a different waveband, said pivotal display body having first and second positions corresponding to the first and second position of said pivotal plate.

14. A tuning display mechanism according to claim 13 wherein the pivotal plate and the pivotal display body are pivotal about axes which are parallel to each other.

15. A tuning display mechanism according to claim 14 wherein said tuning display means includes a spring coupled to at least one of said pivotal display body and said pivotal plate and forming an overcenter spring assembly for the combination of said pivotal display body and said pivotal plate.

16. A tuning display mechanism according to claim 15 wherein an arm projection extends between said pivotal plate and said pivotal display body and is rigidly connected to at least one of said pivotal display body and said pivotal plate for the transmission of pivotal motion there between.

17. A tuning display mechanism according to claim 16 wherein the pivotal axes of the pivotal display body and the pivotal plate are generally perpendicular to the slidable movement of said pushbutton assemblies.

* * * * *